United States Patent
Nalbantis

(10) Patent No.: US 7,111,216 B2
(45) Date of Patent: Sep. 19, 2006

(54) SCAN CONTROLLER AND INTEGRATED CIRCUIT INCLUDING SUCH A CONTROLLER

(75) Inventor: Dimitris Nalbantis, West Malling (GB)

(73) Assignee: Analog Devices, Inc., Norwood, MA (US)

(*) Notice: Subject to any disclaimer, the term of this patent is extended or adjusted under 35 U.S.C. 154(b) by 458 days.

(21) Appl. No.: 10/406,872

(22) Filed: Apr. 4, 2003

(65) Prior Publication Data

US 2004/0148553 A1 Jul. 29, 2004

(30) Foreign Application Priority Data

Jan. 28, 2003 (GB) .................. 0301956.9

(51) Int. Cl.
*G01R 31/28* (2006.01)

(52) U.S. Cl. .................................... 714/726
(58) Field of Classification Search ............... None
See application file for complete search history.

(56) References Cited

U.S. PATENT DOCUMENTS

| 6,378,093 B1* | 4/2002 | Whetsel ................ 714/726 |
| 6,766,487 B1* | 7/2004 | Saxena et al. ........... 714/726 |
| 2003/0149924 A1* | 8/2003 | Bedal et al. ............. 714/726 |
| 2004/0177300 A1* | 9/2004 | Biewenga et al. ........ 714/727 |

* cited by examiner

*Primary Examiner*—Christine T. Tu
(74) *Attorney, Agent, or Firm*—Wolf, Greenfield & Sacks, P.C.

(57) ABSTRACT

An integrated circuit is provided in which a scan controller for controlling a scan test is integrated within the integrated circuit and shares the same input pins as a serial programmable interface of the integrated circuit.

21 Claims, 4 Drawing Sheets

SCAN CONTROLLER AND INTEGRATED CIRCUIT INCLUDING SUCH A CONTROLLER

FIELD OF THE INVENTION

The present invention relates to a scan controller and to an integrated circuit including such a controller.

BACKGROUND OF THE INVENTION

With increasing complexity of integrated circuit devices, such as RF transceivers, signal processing circuits, data processing circuits and other integrated circuits, the digital circuitry needed to control and assist that functionality is also becoming more complex. As a result tests which can quickly identify faulty devices before applying lengthy analog functional tests can help simplify and speed production testing. A scan path approach offers an inexpensive way of testing digital functionality.

SUMMARY OF THE INVENTION

According to a first aspect of the present invention there is provided a scan controller for controlling scan path testing within a target device having a serial programmable interface, wherein the scan controller shares a plurality of input pins with the serial programmable interface, and the scan controller is arranged to detect a predetermined signal indicative of the end of the test and to enable operation of the serial programmable interface.

It is thus possible to enable signals for scan path testing to be propagated into the circuit under test using the same pins or connectors that are also used to control the integrated circuit via its programmable serial interface.

The use of the serial interface pins or contacts as input contacts for the scan controller reduces the pin requirements of the device. However, the serial interface naturally tries to interpret the test sequence as instructions sent to it over it's contacts. In order to overcome this problem the serial programmable interface needs to be inhibited from interpreting the signals provided on the shared inputs during a test sequence.

However, having inhibited the operation of the serial programmable interface, the interface cannot then be instructed to resume normal operation at the end of the test. Whilst it would be possible to reset the device under test by de-powering it, waiting for it to discharge and then re-powering it, this is a cumbersome and relatively slow process in a test environment. Furthermore the device under test must then be allowed time to re-establish a "settled" state before further testing of the device can be performed. However the provision of a scan controller which can monitor the scan test sequence and determine when it has finished enables the serial programmable interface to be re-enabled without performing a power off reset. This significantly speeds up the test process.

Advantageously the serial programmable interface includes a control register. A word or bit may be written to the control register so as to initiate operation in the test mode. Typically the programmable serial interface contains a plurality of registers and in order to access a register a register address must be included in the control sequence sent to the serial programmable interface.

Advantageously one bit in the control register determines what mode, i.e. normal or scan test, the integrated circuit is operating in. Thus when the bit is set to one state, for example zero, the serial programmable interface is enabled and the test circuitry within the device is in a disabled or non-testing state, whereas when the bit is set to it's other state, e.g. "1", then the serial programmable interface is disabled and the test circuitry is in a test state.

Advantageously the or each logic block that is to be tested using a scan path test is preceded and followed by latches. These latches are ordinarily provided so as to present stable input signals to the logic block at a predetermined time. In effect they serve to stop intermediate or transient signal states being propagated into or from the logic block. This is particularly useful when the logic block is formed of asynchronous (un-clocked) components.

Advantageously the latches are associated with a multiplexer such that they can be used in a first mode to present data to and receive data from the logic block during it's normal operation; and in a test mode they can present the input vector to the logic block during a test and can latch the output result at a user defined moment and can then shift the result out of the device thereby making it available for analysis.

Preferably the scan controller is a finite state machine. This is advantageous since all of the operational states of the state machine can be defined and it is possible to ensure that the state machine can always be returned to a given condition, such as the end of test condition. By use of a state machine it is also possible to ensure that a small number of input pins (or even a single input pin/connection) can control many functions as the input can have different control functionality in different states of the state machine.

According to a second aspect of the present invention, there is provided an integrated circuit comprising: a serial programmable interface which has first, second and third inputs; at least one logic block having a plurality of inputs and outputs, and scan testing circuitry, the scan test circuitry comprising scan registers for presenting a test vector to the at least one logic block and for selectively capturing an output vector from the logic block and a scan controller having first, second and third inputs, wherein the scan controller and the serial programmable interface share first, second and third input connections to the integrated circuit and upon entering a test mode the normal functioning of the serial programmable interface is disabled, and the scan controller is responsive to an input signal for terminating the test mode.

According to a third aspect of the present invention there is provided a method of initiating and terminating a scan path test within a device having a serial programmable interface and wherein input lines of the serial programmable interface are shared as inputs during the scan path test, and wherein the device further includes a scan path controller, the method comprising steps of:
A) In response to a predetermined test initiation command given over the input lines, one of the serial programmable interface and the scan controller initiating a test mode and disabling the serial programmable interface; and
B) In response to a predetermined end of test command given over the input lines the scan controller terminates the test mode and the serial programmable interface is re-enabled.

BRIEF DESCRIPTION OF THE DRAWINGS

The present invention will further be described, by way of example only, with reference to the accompanying drawings, in which.

Figure 1:
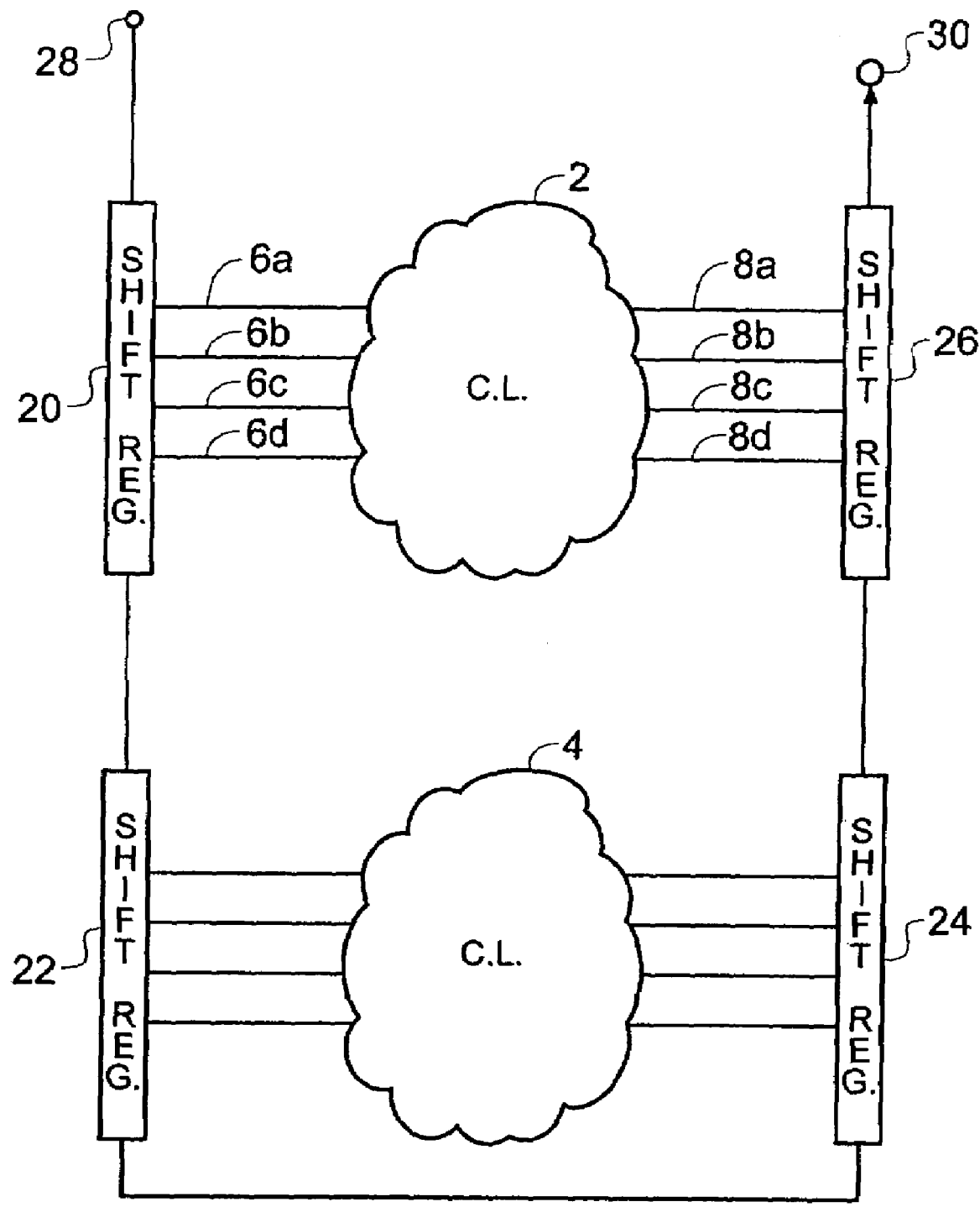
FIG. 1 schematically illustrates a scan path approach for testing combinational logic.

As noted hereinbefore, it is desirable to be able to test the functionality of combinational logic blocks 2 and 4 within an integrated circuit. If device pins were readily and freely available then the quickest approach would be to provide pins to each of the input lines 6a, 6b, 6c, 6d of logic block 2 and also on the output lines 8a to 8d of the combinational logic block 2. The number of input lines does not have to match the number of output lines. Reference to inputs and outputs 6a to 6d and 8a to 8d are purely for illustrative purposes only. An input word can be loaded in parallel into the combinational logic block 2 and the output word could be removed in parallel from the combinational logic block 2. The input word is commonly referred to as a test vector.

In the real world where devices are becoming ever more complex, device connections are at a premium and indeed some package profiles may not be able to support all of the connection/pins that a circuit designer would wish. Such restrictions on pins generally makes it impossible to provide the parallel inputs and outputs for testing functionality described so far.

In order to overcome this, scan chain techniques have been developed wherein serial shift registers 20, 22, 24 and 26 are provided around the combinational logic blocks 2 and 4. A test vector can be serially shifted in to the registers 20 and 22 via a single input pin 28. Thus, with care, it is possible to define the test vector which is to be presented to the combinational logic blocks 2 and 4. Once the test vector has been loaded, a snapshot of the outputs of the combinational logic blocks 2 and 4 may be captured by allowing the signals on the output lines 8a to 8d to parallel load into the shift registers 24 and 26. Once the registers 24 and 26 have been loaded in this way, they are then inhibited from capturing further data from the combinational logic blocks 2 and 4 and the results in the registers 24 and 26 are then sequentially shifted out onto a single output pin 30.

The components to provide scan path testing are themselves integrated into the device that is to be tested. This is cost effective because the shift registers can be formed utilising pre-existing gates around the combinational logic block and hence the overhead on die area is not significant. Scan chain testing does, however, provide a rapid way of identifying devices which have manufacturing faults in the combinational logic blocks under test and these devices can then be removed from the production batch.

It will be noted that register 22 on the input side of the scan chain is connected to register 24 on the output side of the scan chain. This has the advantage that a bit sequence can be serially shifted from the input 28 to the output 30 in order to verify that the scan chain components are themselves functioning properly before commencing the scan chain test of the combinational logic blocks, and this feature can also be used to shift in initial known values into registers.

For complex integrated circuits it is generally necessary to be able to change certain parameters of their functionality. For example, in the context of a transceiver such changes might include gain applied to the output amplifiers, RF frequency, selectivity of filters, centre frequency of filters and so on. In order to achieve this various registers are provided in the integrated circuit into which a digital word controlling the operation of one or more of the device functions can be written. In fact, it is generally necessary to have a plurality of registers. Again, with device connections being at a premium it is generally not possible to allow the registers to be addressed either individually or via a parallel databus. In order to overcome this problem, it is well known to provide a three-pin serial programmable interface, of the type schematically shown in FIG. 2. The serial programmable interface 40 comprises a shift register 42 which has a serial data input pin and a serial clock pin. The operation of the shift register is well known, and essentially consists of a chain of registers with the contents of one register being shifted to the subsequent register at each predetermined clock event, such as a rising edge of the clock. Thus a serial input can be converted into a parallel word within the register 42. It is often inconvenient or impossible to stop the serial clock (the clock may be required by other parts of the integrated circuit, circuit board or system) and therefore it also becomes necessary to provide a further input to the interface to instruct the register 42 whether it should be shifting data in response to the serial clock transitions or whether a selected one (selected by address decoder 44) of the registers 43 should load data irrespective of the status of the serial clock. The pin which determines whether the data should be latched or shifted in response to transitions on the serial clock is designated as a SEN pin.

Typically the input shift register will hold a word which is divided into an address portion and a data portion. The address portion is examined by an address decoder upon the transition of the SEN pin from a shifting to a latching state, and the address decoder 44 then selects an appropriate one of the registers, register 1 to register N which is to be modified by the data portion within the word. In a preferred embodiment of the present invention the shift register accepts a 24 bit word, five bits of which are decoded by the address decoder, with the remaining 19 bits being available to the use of data within the selected one of the registers register 1 to register N.

Figure 2:
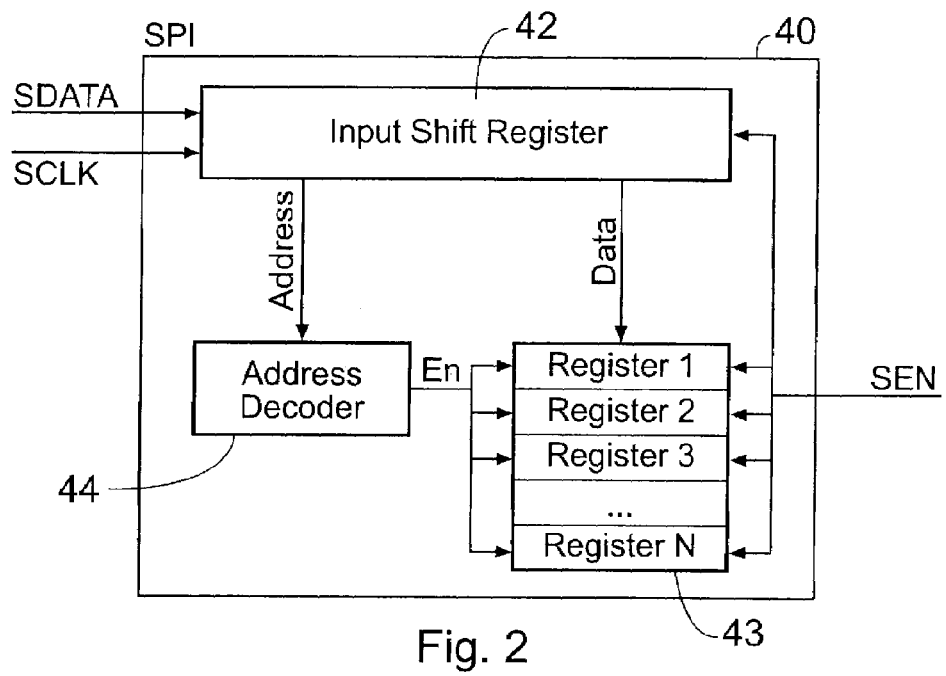
FIG. 2 schematically illustrates the pin arrangement of a three-pin serial programmable interface.

The three-pin serial interface of the type described in FIG. 2 makes for a very pin efficient input interface.

Figure 3:
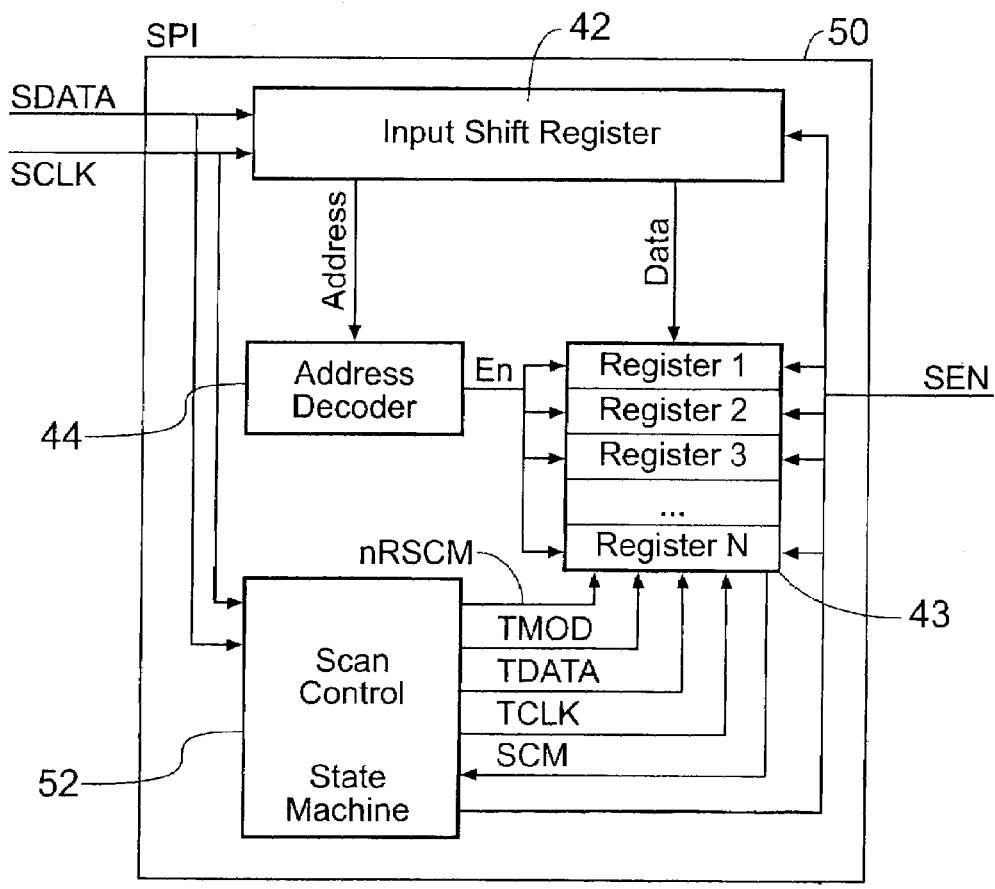
FIG. 3 schematically illustrates an integrated circuit including a scan path tester and a serial programmable interface, and constituting an embodiment of the present invention.

It could be seen that essentially the serial programmable interface 40 requires a serial data input, a serial clock and a control pin, SEN. It can also be seen that the scan chain shown in FIG. 1 requires a serial data input, a serial clock and a mode control pin to tell the latches whether they are shifting data or latching data. Thus there is essentially an identity between the inputs of the scan chain circuitry and the serial programmable interface. The inventor has realised this and has produced a modified serial programmable interface which incorporates a scan chain controller, as shown in FIG. 3. Comparing the serial interface 50 shown in FIG. 3 with that of the device 40 shown in FIG. 2 it can be seen that the serial programmable interface now includes an additional component, namely the scan controller 52. The scan controller 52 is connected to the serial data and serial clock pins of the serial programmable interface 50 and also receives data from the SEN pin. The scan controller produces various outputs such as a test clock TCLK, test data TDATA (these can merely be copies of the serial clock and the serial data input) and a test mode output whose function will be described in further detail hereinafter. An output of the scan chain, for example the output of the register 26 shown in FIG. 1, is presented to a test data output pin 30. The output pin is generally a reconfigurable "general purpose" connection that is provided in association with its own multiplexer such that the pin/connection can provide a programmable connection to one of several nodes within the circuit. Thus in the scan chain test mode the scan controller sends a signal to the multiplexer such that the general purpose pin is connected to the serial output of the register 26. If pin allocation on the device package is so tight that such a pin can no longer be made available, then the scan chain output can be multiplexed onto another device pin as appropriate.

The scan controller 52 is also responsive to a scan mode control bit, SCM, which is predefined in one of the registers, register 1 to register N, which serves to function as a control register. This bit may for example be set to initiate scan mode, and when it is reset scan mode is inhibited. The scan controller 52 also has an output RSCM for resetting the scan mode control bit. Thus the serial programmable interface can set the scan mode bit via the shift register and address decoder 44 and only the scan controller 52 can reset the scan mode bit (although this bit will also be reset at power up). This is because once the scan mode bit has been set the normal operation of the serial programmable interface has to be disabled as otherwise it will try to interpret the test vector as instructions to it.

It is clearly important to be able to ensure that it is always possible to return the device from scan mode to its normal operating mode. However there are not enough pins available on the device in order to define a dedicated reset pin. Therefore this function must be entrusted to the scan controller.

The scan controller 52 needs to be able to determine;
1. When the scan registers are to latch data
2. When the scan registers are to shift data
3. When test mode is to be exited.

These three conditions need to be determined unambiguously by the scan controller. However a range of inputs available to the device is necessarily limited. However, the inventor has realised that with careful design the scan controller 52 can be arranged to fulfil it's role using only the inputs provided on the serial programmable interface.

Before discussing the operation of the scan controller further, it is worthwhile to consider a typical device configuration so that the operation in normal and test modes is more fully understood. Once again, the configuration discussed is by way of example only.

Figure 4:
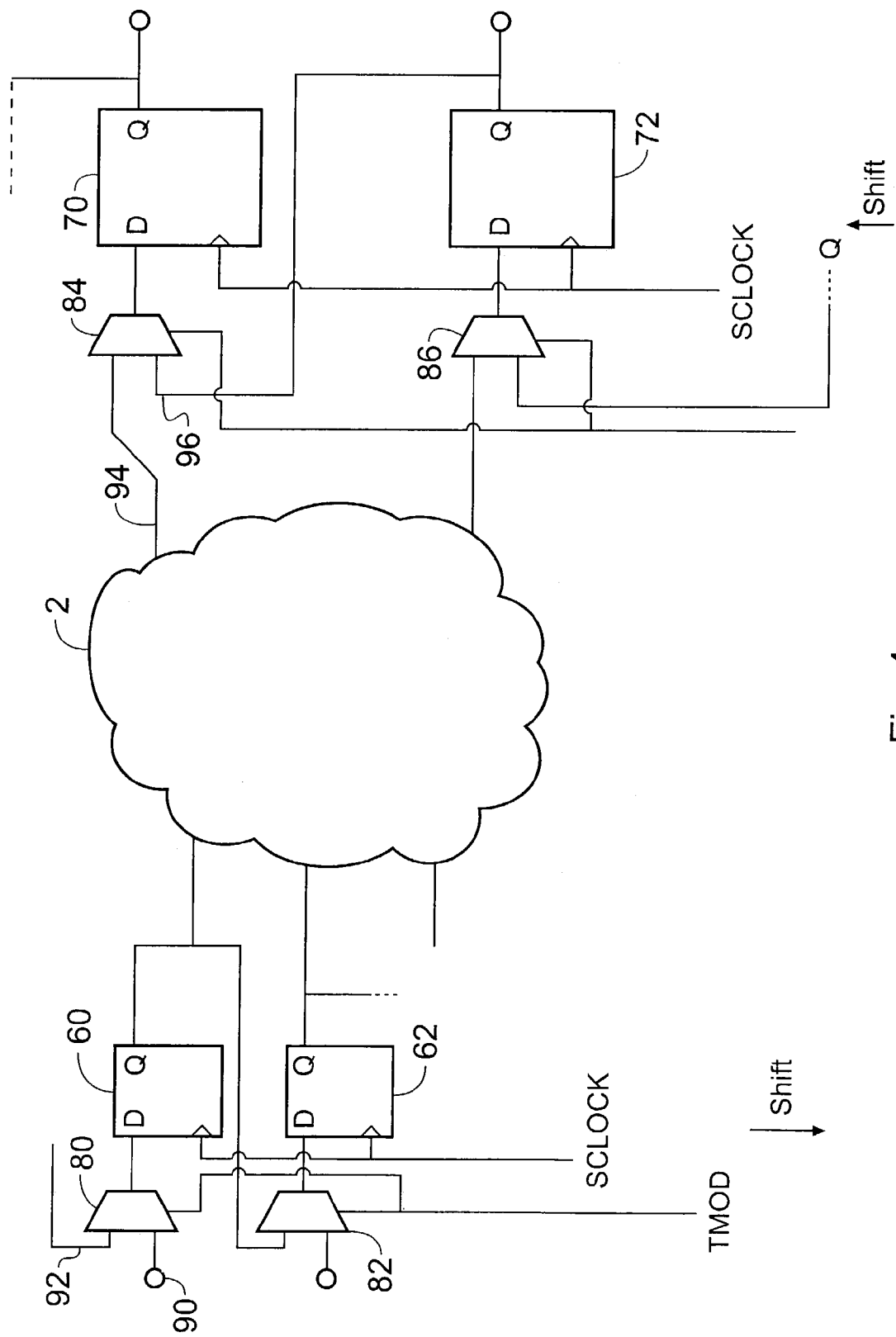
FIG. 4 schematically illustrates an arrangement of input and output multiplexers and latches surrounding a combinational logic block.

In order to enable normal functionality of the device and also to implement scan chain testing it is necessary to be able to deliver signals to and receive signals from the combinational logic block 2. Because of the asynchronous nature of combinational logic it is generally bounded by input latches, of which latches 60 and 62 (see FIG. 4) are examples and output latches of which latches 70 and 72 are examples. Thus the registers 60, 62, 70 and 72 are already provided whether or not scan chain testing is implemented within the device. The registers may be "D" type registers (sometimes known as D type flip-flops). However it is easy to convert these registers to dual purpose registers such that they can also form the shift registers used in scan chain testing. FIG. 4 shows a circuit in which this has been done. Each register 60, 62, 70 and 72 is preceded by a respective two channel multiplexer 80, 82, 84 and 86. The multiplexer 80 has a first input 90 which serves as the normally used data input to the register 60, and a second input 92 which serves as the test input. The multiplexer is responsive to a test mode signal TMOD. Thus, when the device is not in test mode the multiplexer 80 acts to present the signal at the input 90 to a data input of the register 60, whereas when the device is in test mode the signal 92 is presented to the register 60. The test mode connection connects to the Q output (signal output) of the preceding register where there is one (or the test data signal TDATA of the scan control for the first flip-flop in a series of registers) to the input of the following register. Thus, it can be seen that the output of the D type register 60 connects to the test mode input of the multiplexer 82 similarly the Q output of the register 62 will connect to the test mode input of the subsequent multiplexer (not shown) in the chain.

A similar arrangement is implemented on the output side of the combinational logic block 2. Here the registers 70 and 72 either operate to capture the output data from the combinational logic block 2, and make it available for subsequent processing, or they act to shift a captured output sequence to the output pin for analysis during scan chain testing. Thus whereas if scan chain testing was not included the D input of the register 70 would connect directly to the first output 94 of the combinational logic block 2, now a two channel multiplexer 84 is interposed between the combinational logic block 2 and the D type register 70. A second input 96 of the multiplexer 84 is connected to the Q output of the D type register 72. Thus, when in the scan test mode the output of the register 72 can be shifted into the register 70. Thus, the registers on the left hand side of FIG. 4 shift downwardly in the direction of that Figure and the registers on the right hand side of FIG. 4 shift upwardly. More registers and multiplexers may be provided, one for each input and output of the combinational logic. Thus the addition of the multiplexers allows the registers to form the scan chain shift registers. It should be noted that whilst performing a scan test the multiplexer input signal TMOD will vary between its two states. It can be seen that when shifting the scan vector into the input registers 20, 22, 60 and 62, TMOD is set such that the multiplexers select the output of a register as the input to the succeeding register. This applies for both the input registers 20, 22 and the output registers 24, 26, 84, 86 as it is convenient to drive all the multiplexers from the same signal. Once the correct input vector (sequence) has been established the corresponding output appears at the outputs of the combinational logic blocks 2, 4. This output must be captured. It is as if a "snap shot" is to be taken of the outputs, and all subsequent changes are to be ignored. In order to take the "snap shot" the state of TMOD is changed such that the multiplexers 84 and 86 select their respective outputs of the logic block for presentation to their associated registers. The multiplexers 80 and 82 also receive this change in TMOD but it does not effect the signal supplied to the inputs of the combinational logic block because these are held by the latches 60 and 62. On the next transition of SCLOCK the outputs of the combinational logic are latched (captured) by the registers 70 and 72. TMOD is then set such that the multiplexers select the output from the preceding registers. Thus the registers form a shift register and the captured snap shot of the outputs of the combinational logic blocks (or indeed any other type of logic block testable by this technique) is shifted out of the shift register bit by bit on each trigger edge of the serial clock.

Figure 5:
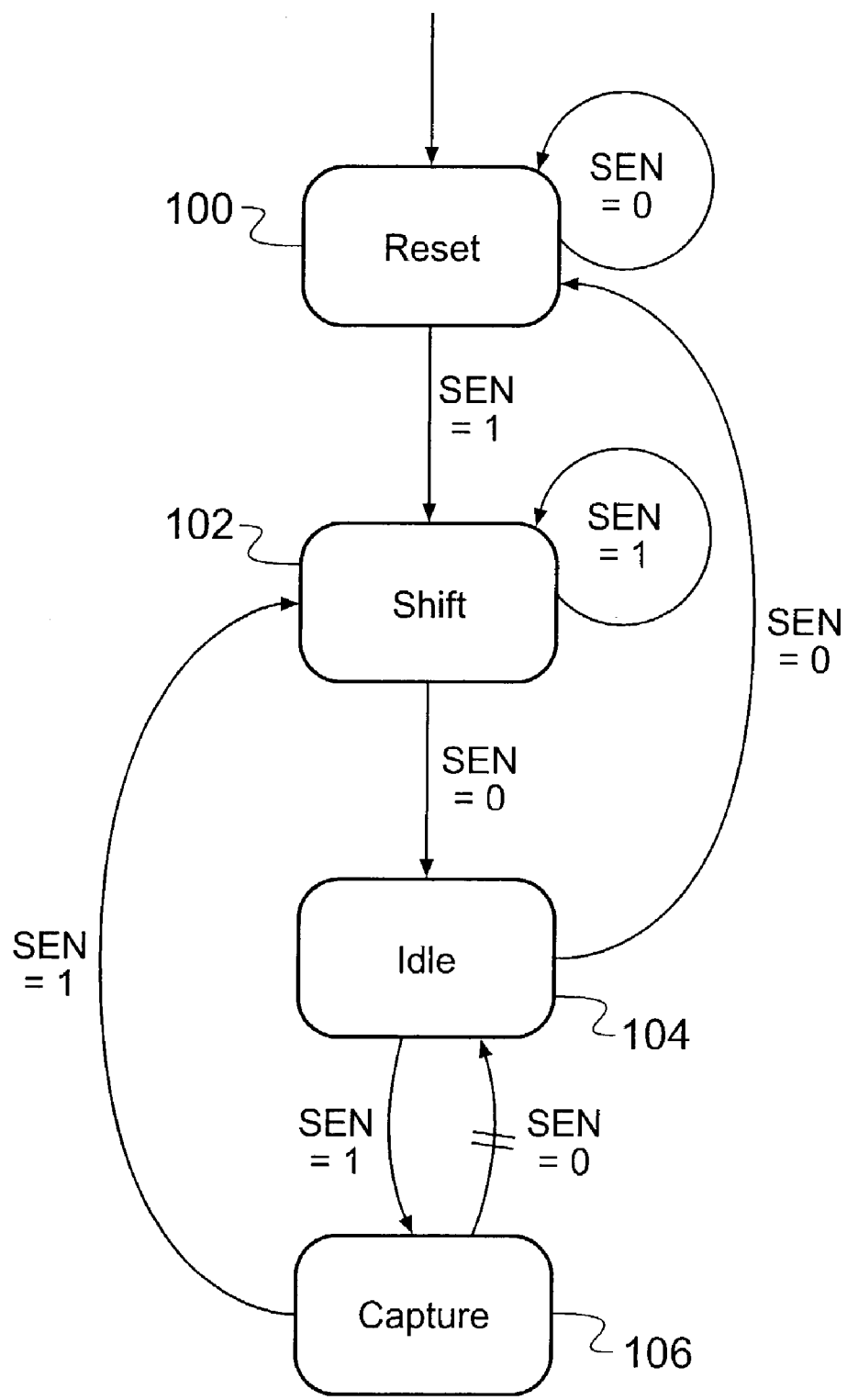
FIG. 5 schematically illustrates the states implemented in an embodiment of a finite state machine scan path controller.

FIG. 5 schematically illustrates an exemplary sequence of states within the scan controller. The scan controller is advantageously implemented as a finite state machine as this enables its reliable operation to be ensured. Given that the serial data and serial clock pins are used for the shifting of data, it becomes apparent that only the SEN pin is available as an input pin to determine what functions the state machine should enable. Thus each state in the state machine has only two possible exits depending on whether the value of SEN is 0 or 1. In this example the first state 100 is entered by setting the test bit in the control register to test. The state to state transitions are made on each rising edge of the serial data clock, SCLOCK. If SEN equal zero then a transition is made from state 100 to state 100. Entering state 100 in this way causes the test mode control bit within the control register to be reset, thereby disabling the scan test mode and re-enabling normal operation of the serial programmable interface. However if on the first clock transmission SEN is not equal to zero then control passes from state 100 to state 102 which is a shift state, thereby causing the contents of the registers to be sequentially shifted from one register to the subsequent register. Thus the content of register 60 is shifted to that of 62 and the content of D type register 72 is shifted to the register 70 and the content of the register preceding register 72 is shifted into the register 72, and so on. If SEN remains equal to 1 then a path is always taken from state 102, that path always ending in state 102. Thus maintaining SEN equal to 1 causes the shift in operation that is necessary in order to accomplish scan chain testing. However, if on the rising edge of a clock SEN equals zero then control is shifted from state 102 to state 104 which is an idle state. State 104 has two exit paths. If SEN equals zero then a transition is made from state 104 to state 100, the entry of which causes the test mode control bit to be reset and hence the test mode to be terminated. However if SEN equals 1 then a transition is made from state 104 to a capture state 106 where the latches, or at least the output latches, are operated so as to capture and record the outputs of the combinational logic. This is accomplished by changing the state of the TMOD signal for one clock pulse as described hereinbefore. From state 106 a transition along a path ending at state 102 is initiated if SEN equals 1. Thus captured data can be shifted out of the registers. Thus, from the idle state keeping SEN equal to 1 first of all initiates one capture of the data at the output of the combinational logic block 2 and then causes this data to be sequentially shifted out along the scan chain. It is also possible to provide a path going from the capture state 106 to the idle state 104 when SEN equal zero although this path could be omitted if so desired. The optional nature of this path is shown by the parallel lines on the path arrow from state 106 to state 104.

It is, of course, possible to introduce additional states in the paths between the states herein described if it so desired. The inclusion of idle states in some of the paths might be useful for reducing the rate at which data is clocked out of the apparatus compared to the serial clock rate if this was helpful in interfacing with the test equipment used to interpret the results of the scan chain test.

It is thus possible to provide an efficient integration of a serial programmable interface and a scan chain test functionality whilst not compromising the reliability of the interface. It can be seen that, at worst, a reset from test mode will always be achieved within two clock cycles of the serial clock if the SEN signal is held low.

It is, of course, possible to invert the states of the "SEN" signal used within the state machine in order to achieve an equivalent operation. This would not depart from the spirit of the present invention.

The invention claimed is:

1. A scan controller for controlling scan path testing of a logic block within a target device having a serial programmable interface providing serial data in, serial clock and mode control pins, wherein the scan controller uses said serial data in, serial clock and mode control pins of the serial programmable interface, and when the serial programmable interface is active, the controller uses the mode control pin in a first state to instruct the serial programmable interface to shift data and in a second state to instruct the serial programmable interface to latch data, and the serial programmable interface is responsive to an instruction to make the scan controller active and to disable the programmable interface itself and, when the scan controller is active, the mode control pin is used to control transitions to a shift state when scan registers are to shift data and a capture state when scan registers are to latch data, and the scan controller is arranged to detect a predetermined signal indicative of the end of the test and to place the scan controller in a state where the scan controller re-enables operation of the serial programmable interface.

2. A scan controller as claimed in claim 1, in which while the scan controller is active, a first signal state on the mode control pin causes the scan controller to enter a capture state to cause output latches provided at the output of a logic block under test to latch the output of the logic block under test.

3. A scan controller as claimed in claim 2, in which following latching of the output, a predetermined signal state on the mode control pin causes the scan controller to control a signal output arrangement to output the contents of the output latches to be sequentially output on a serial data output pin.

4. A scan controller as claimed in claim 3, in which the output latches are selectively configurable such that during a scan test an output of a latch is connected to a data input of a subsequent latch such that the latches form a chain and can sequentially shift data from the latch to latch, the final latch in the chain being connected to the serial data output pin.

5. A scan controller as claimed in claim 1, in which the scan controller is a finite state machine and, wherein following initiation of a test mode the scan controller enters a first state, and wherein an input signal at the mode control pin of the scan controller is examined, and if the signal has a first predetermined value the scan controller initiates a control branch that leads to a second predetermined state, otherwise the test mode is terminated.

6. A scan controller as claimed in claim 5, in which the second predetermined state is a shift state which causes the contents of the input latches to be shifted from a register to a succeeding input latch.

7. A scan controller as claimed in claim 6, in which while in the second predetermined state the input signal to the scan controller is examined and if the input signal has a first predetermined value then a control path is taken which leads to the second predetermined state, otherwise a control path is taken which leads to a third predetermined state.

8. A scan controller as claimed in claim 7, in which the third predetermined state is an idle state.

9. A scan controller as claimed in claim 8, in which while in the third predetermined state the input signal is examined and if the input signal has a first predetermined value a control path is taken which leads to a fourth state, otherwise a control path is taken which leads to the first state.

10. A scan controller as claimed in claim 9, in which the fourth state is a capture state in which the outputs of logic under test are latched by the output latches.

11. A scan controller as claimed in claim 10, in which the input signal is examined and if it has a first predetermined value a control path is taken which leads to the second state.

12. A scan controller as claimed in claim 11 in which if the input signal has a second predetermined value a control path is taken which leads to the third state.

13. A scan controller as claimed in claim 5 in which transitions from states are made in response to a clock signal.

14. An integrated circuit having a serial programmable interface and a scan controller integrally formed there, the scan controller for controlling scan path testing of a logic block within the integrated circuit and the serial programmable interface providing serial data in, serial clock and mode control pins, wherein the scan controller uses said serial data in, serial clock and mode control pins the serial programmable interface, and when the serial programmable interface is active, the controller uses the mode control pin in a first state to instruct the serial programmable interface to shift data and in a second state to instruct the serial programmable interface to latch data, and the serial programmable interface is responsive to an instruction to make the scan controller active and to disable the programmable interface itself and, when the scan controller is active, the mode control pin is used to control transitions to a shift state when scan registers are to shift data and a capture state when scan registers are to latch data, and the scan controller is arranged to detect a predetermined signal indicative of the end of the test and to place the scan controller in a state where the scan controller re-enables operation of the serial programmable interface.

15. An integrated circuit as claimed in claim 14, in which the integrated circuit includes at least one block of combinational logic associated with input latches and output latches.

16. An integrated circuit as claimed in claim 14, in which the integrated circuit is a communication circuit.

17. An integrated circuit as claimed in claim 14, in which the integrated circuit is a transceiver circuit.

18. An integrated circuit comprising: a serial programmable interface which has first, second and third inputs; at least one logic block having a plurality of inputs and outputs, and scan testing circuitry, the scan testing circuitry comprising scan registers for presenting a test vector to the at least one logic block and for selectively capturing an output vector from the logic block; and a scan controller having first, second and third inputs; wherein the scan controller and the serial programmable interface share first, second and third inputs of the integrated circuit and the first input acts as a data input, the second input acts as a clock input, and while the serial programmable interface is enabled, the third input acts in a first state to instruct the serial programmable interface to shift data, and in a second state to instruct the serial programmable interface to latch data, and while the scan testing circuitry is enabled, the third input acts to cause the scan controller to enter a first state to instruct the scan testing circuitry to shift data and transitions on the third input to cause the scan controller to enter a second state to instruct the scan testing circuitry to latch data and upon entering a test mode the normal functioning of the serial programmable interface is disabled, and the scan controller is responsive to an input signal via the shared inputs for instructing the scan controller to terminate the test mode, and to enable operation of the serial programmable interface following termination of the test mode.

19. An integrated circuit as claimed in claim 18, in which the serial programmable interface includes a control register, and test mode is initiated by changing at least one mode bit therein to a predetermined status.

20. An integrated circuit as claimed in claim 19, in which at the end of the test scan controller modifies the at least one mode control bit.

21. A method of initiating and terminating a scan path test within a device having a serial programmable interface and wherein serial data in, clock and mode control input lines of the serial programmable interface are shared as inputs, during the scan path test, with a scan path controller of the device, the method comprising acts of:

A) in response to a predetermined test initiation command given over the input lines, the serial programmable interface initiating a test mode and disabling a normal function of the serial programmable interface; and B) while the scan path controller is active, signals on the mode control input line are used to control the transitions of the scan path controller between a shift state when the scan path shifts data, a latch state when the scan path latches data and an exit from scan path testing when the serial programmable interface is re-enabled.

* * * * *